(12) United States Patent
Oike et al.

(10) Patent No.: US 9,704,550 B2
(45) Date of Patent: Jul. 11, 2017

(54) MAGNETIC ELEMENT, SKYRMION MEMORY AND ARITHMETIC PROCESSING UNIT

(71) Applicant: RIKEN, Saitama (JP)

(72) Inventors: Hiroshi Oike, Tokyo (JP); Fumitaka Kagawa, Tokyo (JP); Yoshinori Tokura, Tokyo (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/168,254

(22) Filed: May 31, 2016

(65) Prior Publication Data
US 2017/0053686 A1    Feb. 23, 2017

(30) Foreign Application Priority Data

Aug. 21, 2015  (JP) ................................. 2015-163431

(51) Int. Cl.
| | | |
|---|---|---|
| G11C 19/08 | (2006.01) | |
| G11C 11/16 | (2006.01) | |
| H01L 43/02 | (2006.01) | |
| G06F 17/16 | (2006.01) | |

(52) U.S. Cl.
CPC .............. G11C 11/16 (2013.01); G06F 17/16 (2013.01); H01L 43/02 (2013.01)

(58) Field of Classification Search
CPC ............................ G11C 19/0866; G11C 13/06
USPC ......................................................... 365/8, 10
See application file for complete search history.

(56) References Cited

FOREIGN PATENT DOCUMENTS

| | | | | |
|---|---|---|---|---|
| JP | 2006-221712 A | | 8/2006 | |
| JP | 2014086470 | * | 5/2014 | ............. H01L 29/82 |
| JP | 2016139673 | * | 1/2015 | ............. H01L 29/82 |
| WO | WO 2016021349 | * | 2/2016 | ............. G11B 5/65 |

* cited by examiner

*Primary Examiner* — Huan Hoang

(57) ABSTRACT

To provide a magnetic element that controls generation and annihilation of a skyrmion. A magnetic element is provided, and the magnetic element comprises: a magnetic body that has a spiral magnetic structure in a stable state; a skyrmion control unit that generates skyrmion in the magnetic body by supplying energy to the magnetic body that has the spiral magnetic structure. Also, the magnetic element in which the skyrmion control unit brings the magnetic body into an unstable state by supplying thermal energy pulses to the magnetic body is provided. Furthermore, a skyrmion memory comprising the magnetic element is provided.

10 Claims, 20 Drawing Sheets

MAGNETIC ELEMENT, SKYRMION MEMORY AND ARITHMETIC PROCESSING UNIT

The contents of the following Japanese patent application(s) are incorporated herein by reference:

NO. 2015-163431 filed in JP on Aug. 21, 2015.

BACKGROUND

1. Technical Field

The present invention relates to a magnetic element, a skyrmion memory and an arithmetic processing unit.

2. Related Art

There are DVD+RWs as an example of devices in which data is recorded by applying thermal energy. With the appearance of blue lasers, the memory capacity of DVD+RWs used in an image recording apparatus has increased dramatically to several tens of GB s. DVD+RWs use phase-change memories that allow rewriting (Patent Document 1).

In case of a phase-change memory, when writing information therein, a part of a material such as GeTe is caused to shift from the crystal phase to the amorphous phase by local heat. Resistance changes between a low resistance state in the crystal phase and a high resistance state in the amorphous phase are utilized as bit information (Patent Document 1).

PRIOR ART DOCUMENTS

Patent Documents

[Patent Document 1] Japanese Patent Application Publication No. 2006-221712

However, in conventional phase-change memories, there is a limit in terms of the time required for a shift from the crystal phase to the amorphous phase, and the required time places a limit on speeding up. Also, shortening of time required for a shift from the amorphous phase to the crystal phase poses a technical development issue such as further thinning of a portion in the amorphous phase than the one in conventional techniques.

SUMMARY

A first aspect of the present invention provides a magnetic element comprising: a magnetic body that has a spiral magnetic structure in a stable state; a skyrmion control unit that generates skyrmion in the magnetic body by supplying energy to the magnetic body that has the spiral magnetic structure.

A second aspect of the present invention provides a skyrmion memory comprising the magnetic element according to the first aspect.

A third aspect of the present invention provides an arithmetic processing unit comprising the skyrmion memory according to the second aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
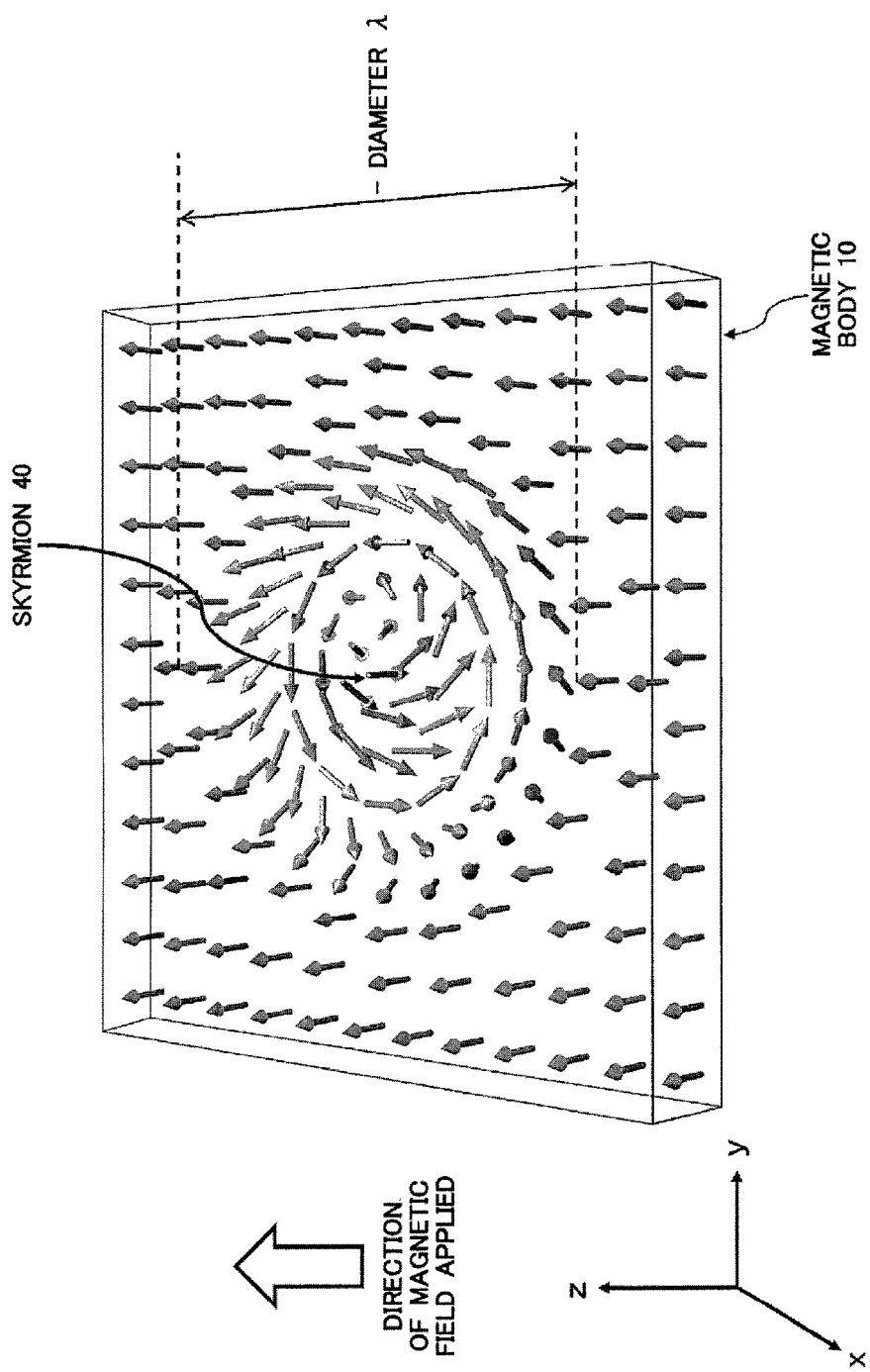
FIG. 1 is a schematic view showing one example of a skyrmion 40 generated in a magnetic body 10.

FIG. 1 is a schematic view showing one example of a skyrmion 40 generated in a magnetic body 10. In FIG. 1, each arrow indicates the orientation of a magnetic moment related to the skyrmion 40. The x-axis and the y-axis are orthogonal to each other, and the z-axis is orthogonal to the xy plane.

The magnetic body 10 has a plane parallel to the xy plane. Magnetic moments that are arranged in the magnetic body 10 and are in every possible direction configure the skyrmion 40. In the present example, the orientation of a magnetic field applied to the magnetic body 10 is the positive z-direction. In this case, the magnetic moment at the outermost circumference of the skyrmion 40 in the present example is in the positive z-direction.

At the skyrmion 40, magnetic moments are arranged as if they rotate in a swirl-like manner from the outermost circumference toward the inner side. Furthermore, the orientations of the magnetic moment gradually change from the positive z-direction to the negative z-direction as they become closer to the center of the swirl along with the swirl-like rotation.

At the skyrmion 40, the orientations of the magnetic moments twist successively between its center and its outermost circumference. That is, the skyrmion 40 is a nano-scale magnetic structural body having a swirl-like structure of magnetic moments. When the magnetic body 10 in which the skyrmion 40 is present is a thin tabular solid material, magnetic moments in the same direction configure the skyrmion 40 in its thickness direction at any point on the xy plane. That is, at any point on the xy plane of the plate, magnetic moments in the same direction configure the skyrmion 40 in the depth direction (z-direction) of the plate from the front surface to the rear surface. The outermost circumference in the present example refers to the periphery of a circle formed by magnetic moments in the same direction with the direction of the external magnetic field shown in FIG. 1.

The skyrmion count Nsk characterizes the skyrmion 40 which is a nano-scale magnetic structural body having a swirl-like structure. The following [Equation 1] and [Equation 2] represent the skyrmion count Nsk. In [Equation 2], the polar angle $\Theta(r)$ between a magnetic moment and the z-axis is a continuous function of the distance r from the center of the skyrmion 40. The polar angle $\Theta(r)$ changes from $\pi$ to zero or from zero to $\pi$ when r is changed from 0 to $\infty$.

$$Nsk = \frac{1}{4\pi} \int\int d^2 r\, n(r) \cdot \left[\left(\frac{\partial n(r)}{\partial x}\right) \times \left(\frac{\partial n(r)}{\partial y}\right)\right] \quad \text{[Equation 1]}$$

$$n(r) = (\cos\phi(\varphi)\sin\Theta(r),\ \sin\phi(\varphi)\sin\Theta(r),\ \cos\Theta(r)) \quad \text{[Equation 2]}$$
$$\phi(\varphi) = m\varphi + \gamma$$

The vector amount n(r) represents the orientation of a magnetic moment of the skyrmion 40 at the location r.

In [Equation 2], m is vorticity, and $\gamma$ is helicity. Based on [Equation 1] and [Equation 2], when $\Theta(r)$ changes from $\pi$ to zero by changing r from zero to $\infty$, Nsk=−m.

FIG. 2A to FIG. 2D are schematic views showing skyrmions 40 having different helicity $\gamma$. In particular, examples in cases of the skyrmion count Nsk=−1 are shown in FIG. 2A to FIG. 2D

Figure 2A:
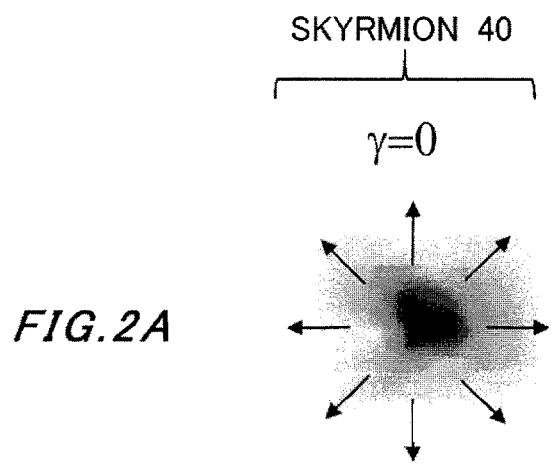
FIG. 2A is a figure showing a skyrmion having different helicity $\gamma$.
Figure 2B:
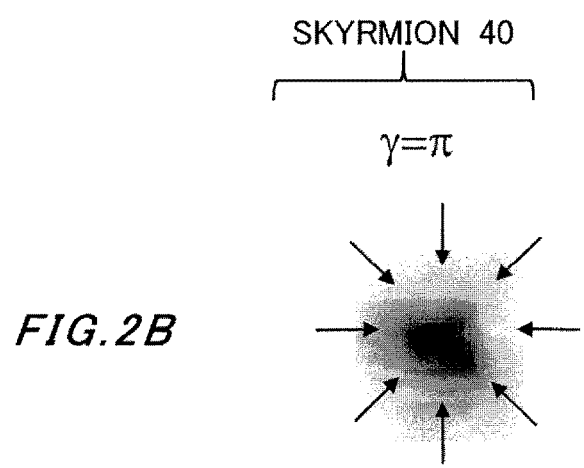
FIG. 2B is a figure showing a skyrmion having different helicity $\gamma$.
Figure 2C:
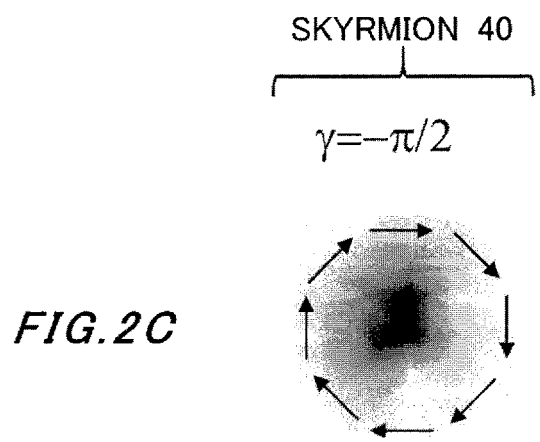
FIG. 2C is a figure showing a skyrmion having different helicity $\gamma$.
Figure 2D:
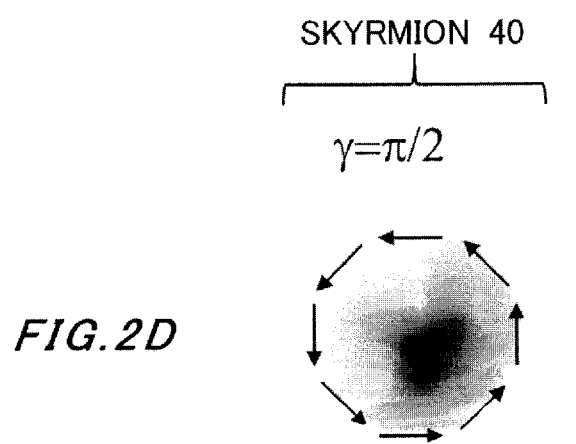
FIG. 2D is a figure showing a skyrmion having different helicity $\gamma$.
Figure 2E:
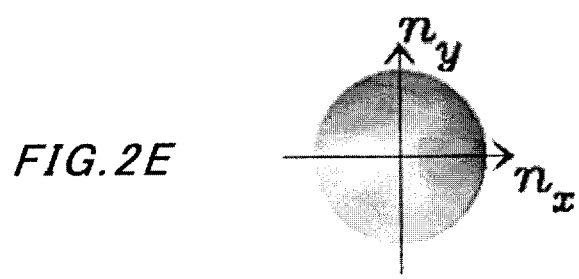
FIG. 2E shows how the coordinates of a magnetic moment n are defined (right-handed system).

FIG. 2E shows how the coordinates of a magnetic moment n are defined (right-handed system). Note that because it is a right-handed system, relative to the $n_x$-axis and the $n_y$-axis, the $n_z$-axis is in a direction from the back to the front on the sheet of paper. Also, a relationship between shading and the orientations of magnetic moments is shown in FIG. 2E.

In FIG. 2A to FIG. 2D, shading indicates the orientations of magnetic moments. Each arrow in FIG. 2A to FIG. 2D indicates a magnetic moment that is apart from the center of the skyrmion 40 by a predetermined distance. The magnetic structural bodies shown in FIG. 2A to FIG. 2D are in a state to define the skyrmions 40. As indicated by the outermost circumferences in FIG. 2A to FIG. 2D, regions where the shading is lightest indicate magnetic moments in a direction from the rear surface to the front side on the sheet of paper. Note that such magnetic moments are expressed in white in the figures.

As shown by the centers in FIG. 2A to FIG. 2D, regions where the shading is darkest indicate magnetic moments in a direction from the front side to the rear surface on the sheet of paper. Note that such magnetic moments are expressed in black in the figures.

The orientation of each magnetic moment in FIG. 2B ($\gamma=\pi$) is an orientation obtained by rotating each magnetic moment in FIG. 2A ($\gamma=0$) by 180°. The orientation of each magnetic moment in FIG. 2C ($\gamma=-\pi/2$) is an orientation obtained by rotating each magnetic moment in FIG. 2A ($\gamma=0$) by −90 degrees (90 degrees clockwise).

The orientation of each magnetic moment in FIG. 2D ($\gamma=-\pi/2$) is an orientation obtained by rotating each magnetic moment in FIG. 2A ($\gamma=0$) by 90 degrees (90 degrees counterclockwise). Note that the skyrmion 40 with the helicity $\gamma=\pi/2$ shown in FIG. 2D corresponds to the skyrmion 40 in FIG. 1.

Although the four exemplary magnetic structures shown in FIG. 2A to FIG. 2D seem different, but are topologically identical magnetic structural bodies. The skyrmions 40 having structures shown in FIG. 2A to FIG. 2D are, once generated, present stably, and function as a carrier to convey information in the magnetic body 10 to which an external magnetic field is applied.

Figure 3:
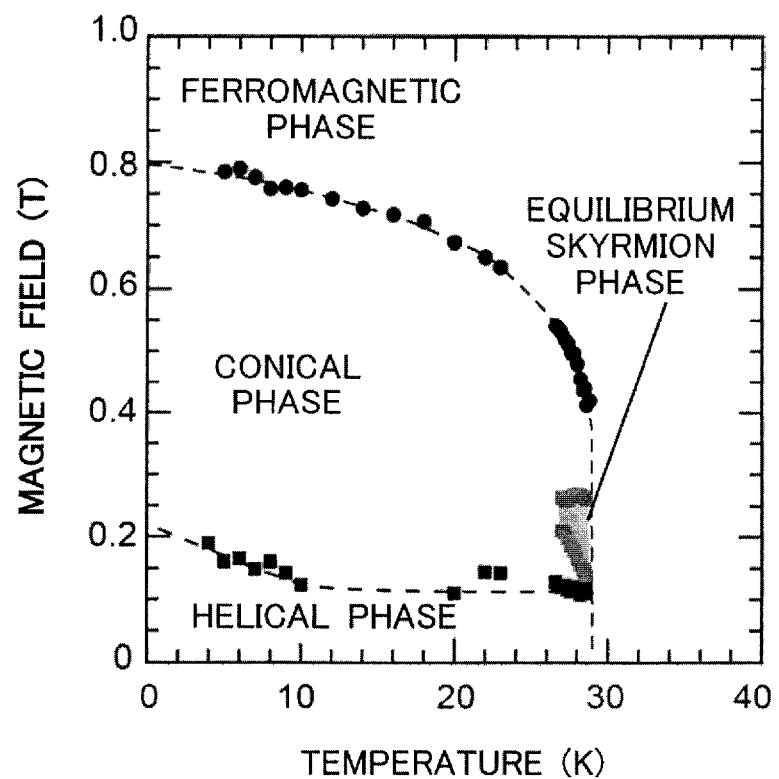
FIG. 3 shows one example of a magnetic phase diagram of the magnetic body 10 in a stable state.

FIG. 3 shows one example of a magnetic phase diagram of the magnetic body 10 in a stable state. The horizontal axis indicates temperatures (K) of the magnetic body 10, and the vertical axis indicates magnetic fields (T) applied to the magnetic body 10 from outside. In the present specification, a stable state refers to a state where the magnetic structure of the magnetic body 10 is stable when it is at a predetermined temperature and a predetermined magnetic field is applied to it. The magnetic structure of the magnetic body 10 in a stable state are classified roughly into a ferromagnetic phase, a conical phase, a helical phase and an equilibrium skyrmion phase depending on temperatures of the magnetic body 10 and magnetic fields applied thereto. Also, in the present specification, magnetic structures in a conical phase and a helical phase are collectively called a spiral magnetic structure. Which magnetic structure the magnetic body 10 has in a stable state is mainly determined by a material of the magnetic body 10.

The equilibrium skyrmion phase is a phase where the skyrmion 40 occurs to the magnetic body 10 stably. The equilibrium skyrmion phase is located around the boundary among the ferromagnetic phase, the conical phase and the helical phase in the magnetic phase diagram. Also, the equilibrium skyrmion phase is located on a high-temperature side relative to the conical phase and the helical phase in the magnetic phase diagram. The equilibrium skyrmion phase has a smaller range in the magnetic phase diagram as compared with the other phases. For this reason, there are many accompanying restraints concerning temperatures of the magnetic body 10 and magnetic fields applied thereto in generating the skyrmion 40 in the equilibrium skyrmion phase. Also, it is difficult to control generation and annihilation of the skyrmion 40 in the equilibrium skyrmion phase.

Figure 4:
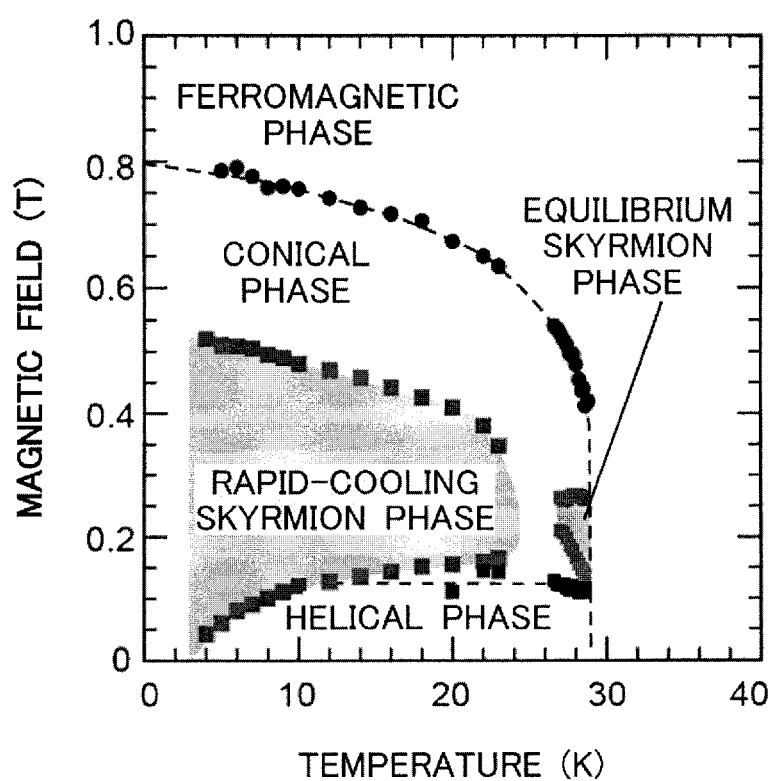
FIG. 4 shows one example of a magnetic phase diagram of the magnetic body 10 including a metastable state.

FIG. 4 shows one example of a magnetic phase diagram of the magnetic body 10 including a metastable state. In the present specification, the metastable state refers to a state which is not a truly stable state, but can be present stably unless there is supply of large energy.

The metastable state is entered by once bringing the magnetic body 10 of the stable state into the unstable state.

For example, the metastable state is brought about by supplying thermal energy to the magnetic body 10 and then rapidly cooling the magnetic body 10 at a predetermined cooling speed or faster. In this manner, the rapid-cooling skyrmion phase is entered as a metastable state by rapidly cooling the magnetic body 10 having entered the unstable state. In the present specification, rapid cooling refers to cooling the magnetic body 10 at a cooling speed of 20 K/s or faster, for example. Note that energy to be supplied to the magnetic body 10 is not limited to thermal energy, but may be other energy such as optical energy or magnetic energy.

The rapid-cooling skyrmion phase is a skyrmion phase in a metastable state that is brought about by rapidly cooling the magnetic body 10. The rapid-cooling skyrmion phase is brought about when predetermined conditions such as the temperature of the magnetic body 10, the magnitude of a magnetic field applied to the magnetic body 10, the cooling speed or the like are met. That is, the range of the rapid-cooling skyrmion phase in the magnetic phase diagram changes depending on these conditions. The rapid-cooling skyrmion phase in the present example is brought about when a magnetic field applied to the magnetic body 10 at a time of heating and cooling of the magnetic body 10 is kept constant, and thermal energy is supplied to the magnetic body 10. On the other hand, the magnetic field applied to the magnetic body 10 at a time of heating or cooling of the magnetic body 10 may be altered, but in this case, the region of the rapid-cooling skyrmion phase may be a region different from that of the rapid-cooling skyrmion phase in the present example.

The cooling speed at a time of rapid cooling is determined according to the temperature of the magnetic body 10 in a stable state (that is, the temperature of the magnetic body 10 before heating), the heating temperature of the magnetic body 10 (that is, the temperature of the magnetic body 10 after heating), the physical properties of a material of the magnetic body 10, and the like. The magnetic phase diagram in the present example is a magnetic phase diagram in a case where rapid cooling is started by terminating heating of the magnetic body 10. In this case, the larger the heating amount of the magnetic body 10, the larger the temperature difference from the magnetic body 10 in a stable state. Accordingly, the cooling speed becomes faster.

Figure 5:
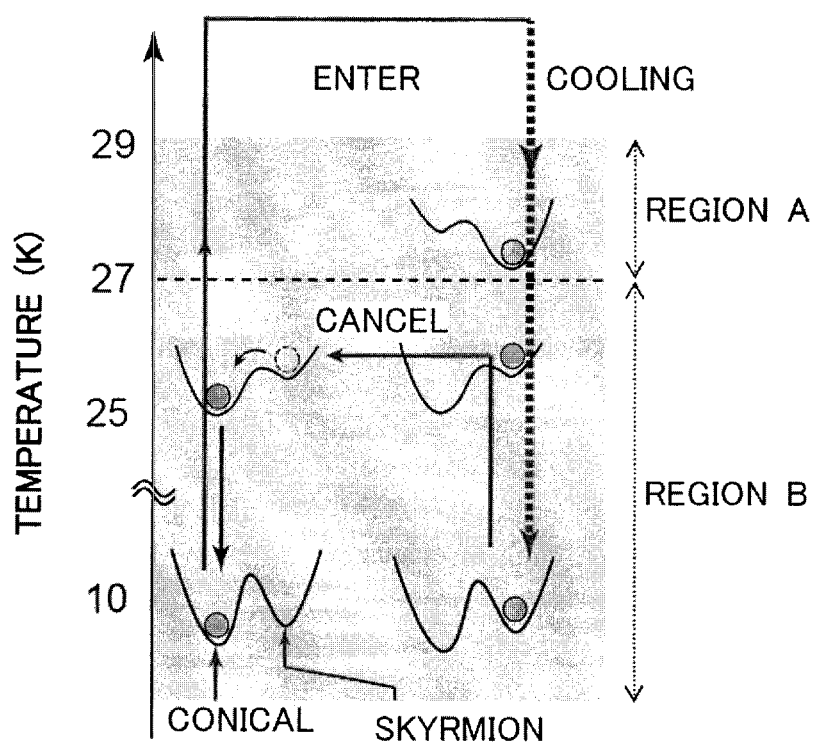
FIG. 5 is a figure for explaining entrance and cancellation of a metastable skyrmion state by current heating.

FIG. 5 is a figure for explaining entrance and cancellation of a metastable skyrmion state by current heating. FIG. 5 shows that a phase shift can be controlled freely between a skyrmion phase and a conical phase by controlling the temperature of the magnetic body 10. The potential figure in the present example shows that the skyrmion phase is brought about when a ball is in a stable region on the right side, and the conical phase is brought about when a ball is in a stable region on the left side.

A region A indicates a temperature range where the magnetic body 10 thermodynamically forms the skyrmion phase stably. The range of the region A changes depending on the material of the magnetic body 10, and the magnitude of a magnetic field applied to the magnetic body 10. The region A in the present example is a temperature range of 27 K or higher and 29 K or lower. That is, the region A corresponds to temperatures around the equilibrium skyrmion phase in the magnetic phase diagram.

A region B indicates a temperature range where the magnetic body 10 thermodynamically forms the conical phase relatively stably. The range of the region B changes depending on the material of the magnetic body 10, and the magnitude of a magnetic field applied to the magnetic body 10. The region B in the present example is a temperature range lower than 27 K. Stabilization in a conical phase is more easily attainable on a high-temperature side of the region B than on a low-temperature side of the region B. That is, a phase shift from the skyrmion phase to the conical phase occurs by keeping the temperature of the magnetic body 10 on the high-temperature side of the region B for a predetermined period.

When generating the skyrmion 40, the magnetic body 10 is heated to a temperature higher than the region A in the magnetic phase diagram of the magnetic body 10. Subsequently, the magnetic body 10 can be caused to enter the skyrmion phase by rapidly cooling the magnetic body 10 to the region B. That is, because the period during which the magnetic body 10 is kept on the high-temperature side of the region B becomes short by rapidly cooling the magnetic body 10, the skyrmion phase can be maintained without a phase shift to the conical phase. Therefore, the skyrmion 40 can be generated at a high probability when a predetermined rapid cooling condition is met. It is important to heat the magnetic body 10 to a temperature higher than the equilibrium skyrmion phase in the magnetic phase diagram of the magnetic body 10 and then rapidly cool the magnetic body 10 to a temperature lower than the equilibrium skyrmion phase.

On the other hand, because the period during which a magnetic body is kept on the high-temperature side of the region B becomes long in a case of gradual cooling, a phase shift from the skyrmion phase to the conical phase occurs at a time of gradual cooling. For this reason, the skyrmion phase is not stabilized at a time of gradual cooling, and the skyrmion 40 cannot be generated.

When the skyrmion 40 is to be annihilated, the magnetic body 10 is kept on the high-temperature side of the region B by heating the magnetic body 10. Because in particular the conical phase becomes stable on the high-temperature side of the region B, the magnetic body 10 can be caused to enter the conical phase by keeping the magnetic body 10 on the high-temperature side of the region B for a certain period. Thereby, a phase shift of the magnetic body 10 from the skyrmion phase to the conical phase occurs. Note that the probability of a phase shift of the magnetic body 10 to the conical phase becomes high by making longer the period during which the magnetic body 10 is kept on the high-temperature side of the region B.

Note that in the present specification, unless an experimental condition is not particularly specified, when the skyrmion 40 is to be generated and annihilated, only the temperature of the magnetic body 10 is changed, and the magnetic field applied to the magnetic body 10 is kept constant. Also, rapid cooling of the magnetic body 10 is realized by stopping supply of thermal energy to the magnetic body 10.

Figure 6:
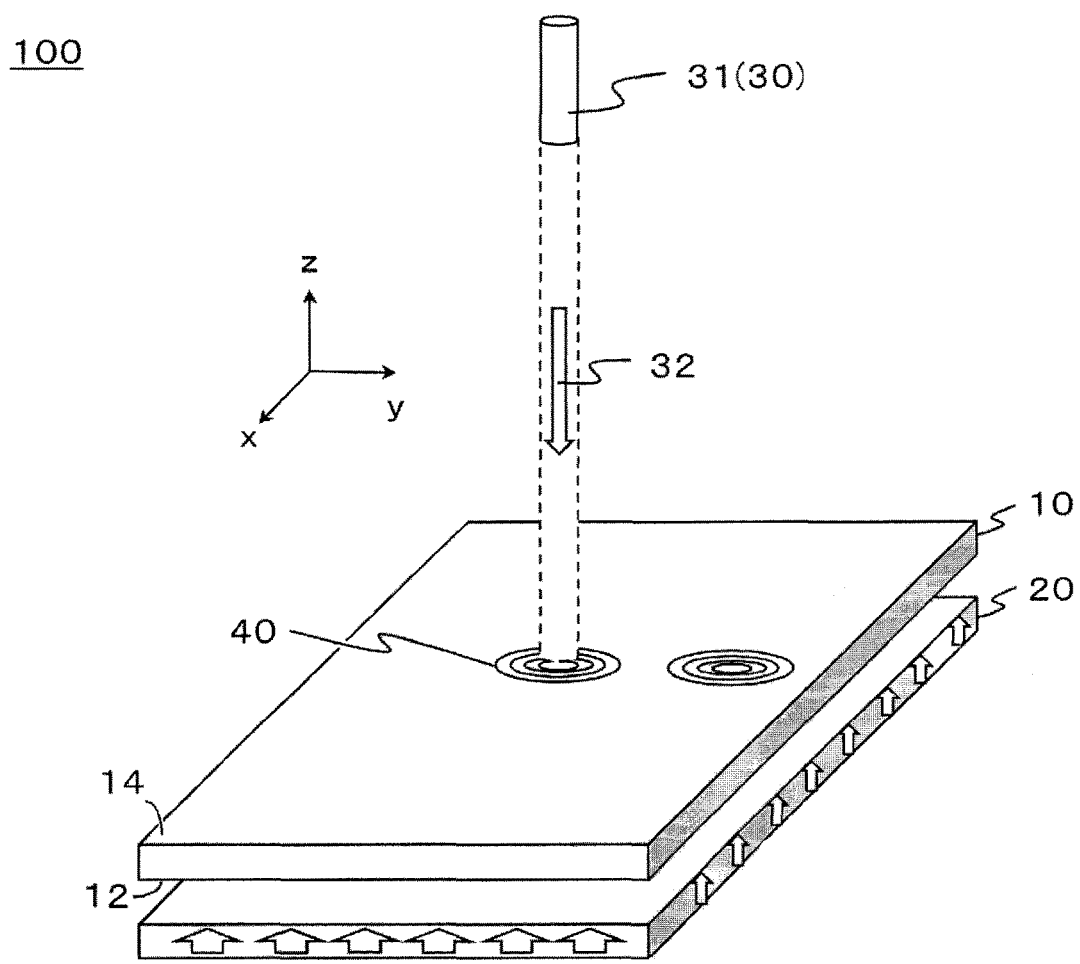
FIG. 6 shows one example of the configuration of a magnetic element 100 adopting an optical absorption heating method.

FIG. 6 shows one example of the configuration of a magnetic element 100 adopting an optical absorption heating method. The magnetic element 100 comprises the magnetic body 10, a magnetic field generating unit 20 and a skyrmion control unit 30. The skyrmion control unit 30 in the present example has a laser source 31.

The magnetic body 10 has a spiral magnetic structure in a stable state. The magnetic body 10 generates and annihilates the skyrmion 40 based on supply of energy. The magnetic body 10 is formed like a thin layer. For example, the magnetic body 10 is formed to have a thickness of 500 nm or thinner by using a technique such as MBE (Molecular Beam Epitaxy) or sputtering. The magnetic body 10 in the present example is formed with FeGe, MnSi or the like. The magnetic body 10 has a first surface 12 and a second surface 14. The first surface 12 and the second surface 14 are planes parallel to the x-y plane.

The magnetic field generating unit 20 generates a magnetic field having a predetermined magnitude. For example, the magnetic field generating unit 20 is a ferromagnetic body formed like a thin film. The magnetic field generating unit 20 is provided to face the first surface 12 of the magnetic body 10. That is, the magnetic field generating unit 20 is arranged in the negative z-direction as seen from the magnetic body 10. The magnetic field generating unit 20 in the present example is arranged to be apart from the first surface 12 of the magnetic body 10 in the negative z-direction and to be approximately parallel to the first surface 12. Thereby, the magnetic field generating unit 20 applies a generated magnetic field in a direction from the first surface 12 of the magnetic body 10 toward the second surface 14 approximately vertically to the magnetic body 10. The magnetic field generating unit 20 may be any unit as long as it generates a magnetic field of, approximately, 0 T or higher and 0.5 T or lower. That is, a commonly used magnetic material can be used as a material of the magnetic field generating unit 20. Note that when the magnetic field generating unit 20 is an insulator made of a ferromagnetic body, the magnetic body 10 and the magnetic field generating unit 20 may be brought into contact with each other.

The skyrmion control unit 30 generates the skyrmion 40 in the magnetic body 10 by supplying energy to the magnetic body 10. For example, the skyrmion control unit 30 supplies, as energy, thermal energy to the magnetic body 10. Supply of thermal energy is performed by using a method such as optical absorption or Joule heating.

The laser source 31 irradiates the second surface 14 of the magnetic body 10 with a laser beam 32. By irradiation of the laser beam 32, a part of the second surface 14 of the magnetic body 10 is heated. The laser source 31 in the present example supplies local thermal energy to the second surface 14, but may irradiate a wider region with the laser beam 32. That is, an optimal irradiation diameter may be selected according to the diameter of the skyrmion 40 or the like. For example, as an apparatus to output thermal energy for generating local thermal energy, a focus electron ray generation apparatus to output an electron ray focused by a focusing coil may be used.

Figure 7:
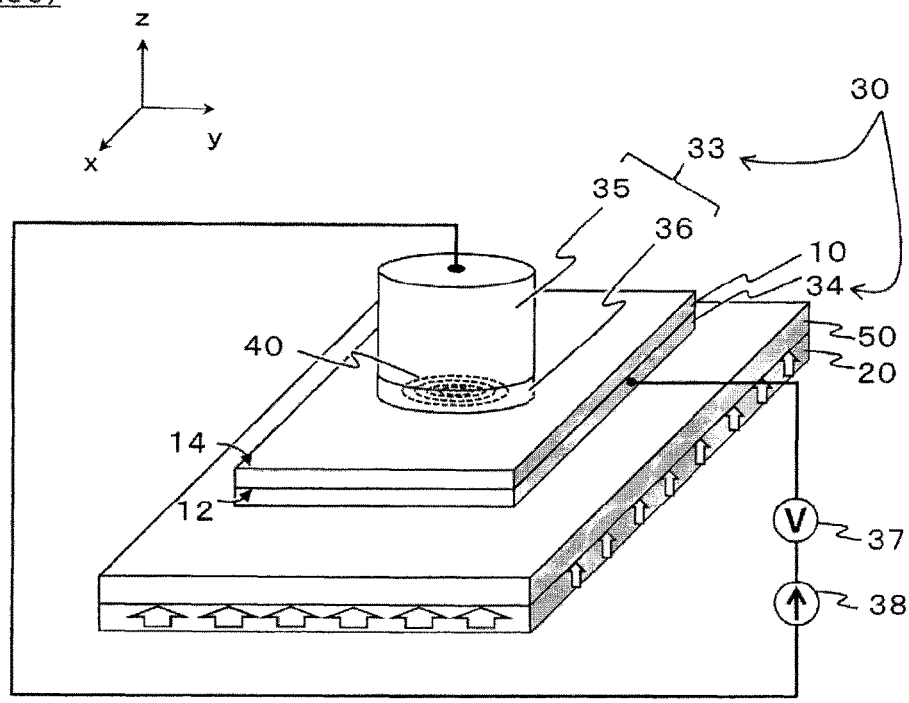
FIG. 7 shows one example of the configuration of the magnetic element 100 adopting a Joule heating method.

FIG. 7 shows one example of the configuration of the magnetic element 100 adopting a Joule heating method. The magnetic element 100 comprises the magnetic body 10, the magnetic field generating unit 20, the skyrmion control unit 30 and an insulator 50. The skyrmion control unit 30 in the present example can perform writing-in, annihilation and reading-out of the skyrmion 40. That is, the magnetic element 100 in the present example can operate as a skyrmion memory 200. Note that the insulator 50 is not required when the magnetic field generating unit 20 is formed with an insulator.

The skyrmion control unit 30 comprises a first electrode 33, a second electrode 34, a power source 37 and an ammeter 38. Instead of using the laser source 31, the skyrmion control unit 30 causes current to flow through the magnetic body 10 to realize generation and annihilation of the skyrmion 40. Also, the skyrmion control unit 30 detects the skyrmion 40 by detecting changes in the resistance value of the magnetic body 10 that result from presence and absence of the skyrmion 40. Note that detection of the skyrmion 40 can be realized also by arranging, on a disk, a sensor such as a tunneling magneto resistance (TMR) element.

The first electrode 33 has a magnetic metal 35 and an insulator 36. The magnetic metal 35 is a cylindrical magnetic metal. For example, the magnetic metal 35 is Co, Ni or Fe which are a ferromagnetic body metal, or a laminar ferromagnetic body metal thin film made of the ferromagnetic body metals. The cross-sectional shape of the magnetic metal 35 is altered as appropriate depending on the size of the diameter of the skyrmion 40 to be generated. The insulator 36 is provided between the second surface 14 of the magnetic body 10 and the magnetic metal 35.

The second electrode 34 is made of a metal provided in contact with the first surface 12 of the magnetic body 10. The second electrode 34 may be a ferromagnetic metal, or may be a nonmagnetic metal such as Cu, W, Ti, Al, Pt, Au, TiN or AlSi. Note that the second electrode 34 may be a magnetic body metal that generates the skyrmion 40. In this case, the magnetic body 10 and the second electrode 34 may be formed with the same material. However, when the resistance value of a magnetic body metal configuring the magnetic body 10 is high, the second electrode 34 is preferably formed with a material having a lower resistance value. The cross-section of the second electrode 34 in the present example may be larger than the cross-section of the first electrode 33. However, the cross-section of the second electrode 34 may have a size which is the same as that of the cross-section of the first electrode 33.

The power source 37 causes pulse-like current to flow between the first electrode 33 and the second electrode 34. The power source 37 has a switch formed with an FET transistor or the like for turning on and off the current. The power source 37 Joule-heats the magnetic body 10 by causing the current to flow pulse-wise through the magnetic body 10. Note that the power source 37 may not be a component of the skyrmion memory 200, but may be provided outside.

The ammeter 38 measures the current value of current flowing through the magnetic body 10. The resistance value of the magnetic body 10 changes according to presence and absence of the skyrmion 40 in the magnetic body 10. That is, the ammeter 38 can read presence and absence of the skyrmion 40 by measuring changes in the current value that result from the resistance value of the magnetic body 10. Note that the ammeter 38 may not be a component of the skyrmion memory 200, but may be provided outside.

When the skyrmion 40 is not present in the magnetic body 10, because the magnetic metal 35 is made of a ferromagnetic body metal, the magnetic moment of the magnetic metal 35 is in the z-direction according to the perpendicular magnetization (z-direction) from the magnetic field generating unit 20. Also, when the skyrmion 40 is not present in the magnetic body 10, the magnetic moment of the magnetic body 10 is similarly in the z-direction. In this case, the magnetic moment of the magnetic metal 35 and the magnetic moment of the magnetic body 10 match and are in an upward direction. For this reason, the tunneling current flowing through the insulator 36 indicates a large current value as compared with the one in a case where the orientations of the magnetic moment of the magnetic metal 35 and the magnetic moment of the magnetic body 10 do not match.

On the other hand, when the skyrmion 40 is present in the magnetic body 10, because a spiral magnetic moment of the skyrmion 40 is present in the magnetic body 10, there are magnetic moments in many orientations other than the +z-direction. For this reason, when the skyrmion 40 is present in the magnetic body 10, the tunneling current is subjected to a significant scattering effect; thus, the resistance of the magnetic body 10 increases. Accordingly, the tunneling current flowing through the insulator 36 decreases as compared with the one in a case where the skyrmion 40 is not present.

As explained above, the magnetic element 100 comprises the skyrmion control unit 30 that controls generation and annihilation of the skyrmion 40. Also, the magnetic element 100 can detect a current value that corresponds to whether or not the skyrmion 40 is present in the magnetic body 10. For example, the magnetic element 100 judges as "generation" of the skyrmion 40 when bit information is "1," and as "no generation" of the skyrmion 40 when bit information is "0."

That is, the magnetic element 100 can operate as the skyrmion memory 200 by generating the skyrmion 40 in synchronization with bit information.

Also, the magnetic element 100 can convert bit information into presence and absence of the skyrmion 40 at constant intervals in the magnetic body 10. For example, thermal energy is supplied to the second surface 14 of the magnetic body 10 by rotating the circular plate-like magnetic body 10 at a constant speed. Thereby, bit information can be retained as presence and absence of the skyrmion 40 in the magnetic body 10 rotating at a high speed. Here, the skyrmion 40 can retain bit information stably because it has a magnetic moment that has a swirl structure consistent not only on the second surface 14 of the magnetic body 10 but also down to the first surface 12.

Figure 8:
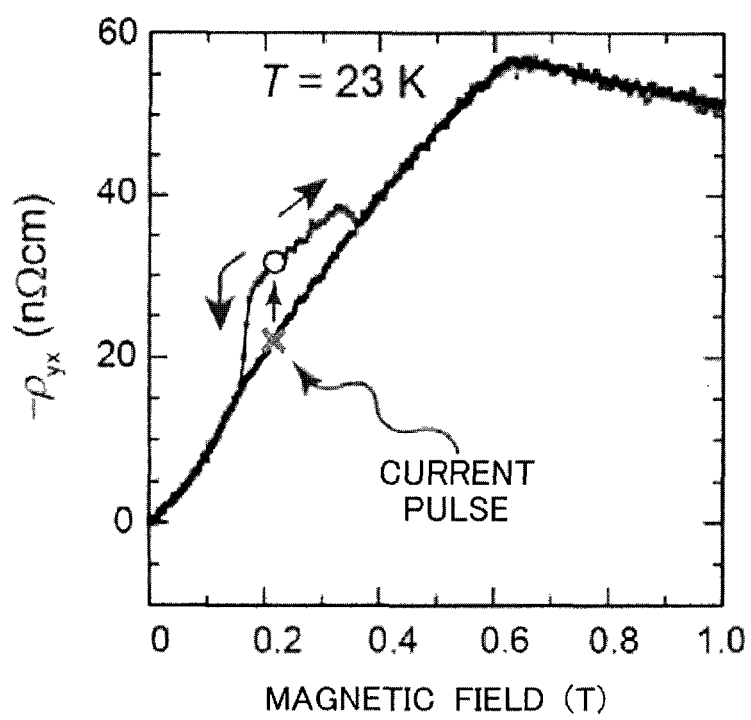
FIG. 8 shows changes in a resistivity according to the skyrmion 40 at a temperature of 23 K.

FIG. 8 shows changes in a resistivity according to the skyrmion 40 at a temperature of 23 K. The horizontal axis indicates a magnetic field (T) applied to the magnetic body 10, and the vertical axis indicates a resistivity $-\rho_{yx}$ (nΩcm) sensed by the skyrmion control unit 30. The magnetic body 10 in the present example is kept at the temperature of 23 K. Note that the resistivity $-\rho_{yx}$ (nΩcm) is obtained by measurement of the Hall voltage.

In the range of the magnetic field 0 T to 0.6 T, when the skyrmion 40 is not being generated, the resistivity $-\rho_{yx}$ (nΩcm) increases linearly along with an increase in the magnetic field. Also, when the magnetic field exceeds approximately 0.6 T, the resistivity $-\rho_{yx}$ (nΩcm) decreases. Here, the resistivity $-\rho_{yx}$ (nΩcm) in a case where current pulses are applied to the magnetic body 10 at the mark x in the figure is indicated with the mark o. When current pulses are applied to the magnetic body 10, the resistivity $-\rho_{yx}$ (nΩcm) increases. That is, it is shown that the skyrmion 40 is generated due to application of current pulses.

Figure 9:
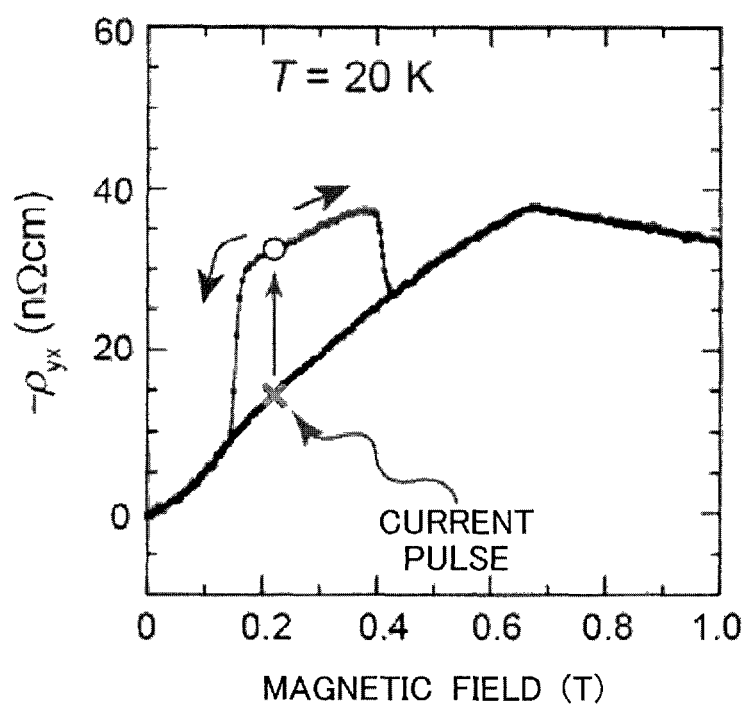
FIG. 9 shows changes in a resistivity according to the skyrmion 40 at a temperature of 20 K.

FIG. 9 shows changes in a resistivity according to the skyrmion 40 at a temperature of 20 K. The horizontal axis indicates a magnetic field (T) applied to the magnetic body 10, and the vertical axis indicates a resistivity $-\rho_{yx}$ (nΩcm) sensed by the skyrmion control unit 30. The magnetic body 10 in the present example is kept at the temperature of 20 K. Note that the resistivity $-\rho_{yx}$ (nΩcm) is obtained by measurement of the Hall voltage.

In the range of the magnetic field 0 T to 0.7 T, when the skyrmion 40 is not being generated, the resistivity $-\rho_{yx}$ (nΩcm) increases linearly along with an increase in the magnetic field. Also, when the magnetic field exceeds approximately 0.7 T, the resistivity $-\rho_{yx}$ (nΩcm) decreases. Here, the resistivity $-\rho_{yx}$ (nΩcm) in a case where current pulses are applied to the magnetic body 10 at the mark x in the figure is indicated with the mark o. When current pulses are applied to the magnetic body 10, the resistivity $-\rho_{yx}$ (nΩcm) increases. That is, it is shown that the skyrmion 40 is generated due to application of current pulses.

Figure 10:
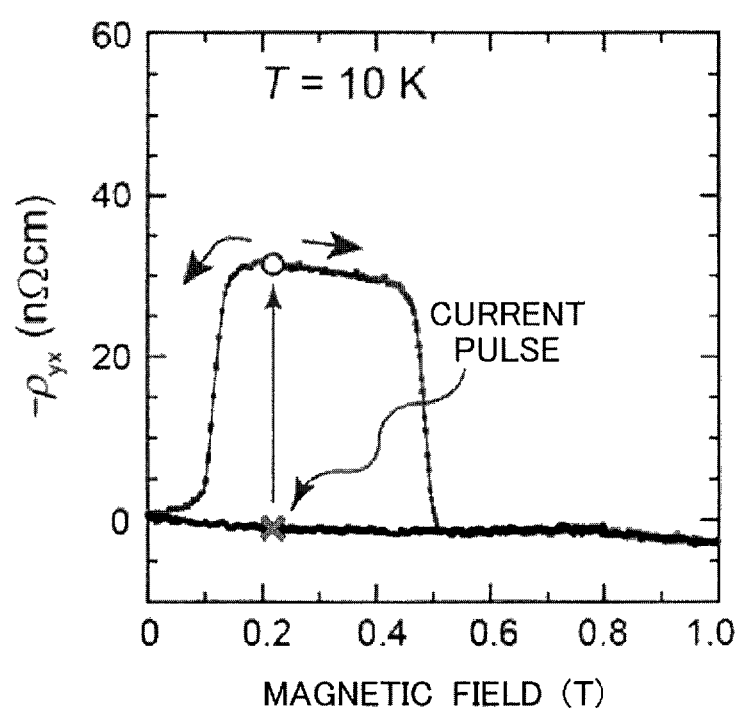
FIG. 10 shows changes in a resistivity according to the skyrmion 40 at a temperature of 10 K.

FIG. 10 shows changes in a resistivity according to the skyrmion 40 at a temperature of 10 K. The horizontal axis indicates a magnetic field (T) applied to the magnetic body 10, and the vertical axis indicates a resistivity $-\rho_{yx}$ (nΩcm) sensed by the skyrmion control unit 30. The magnetic body 10 in the present example is kept at the temperature of 10 K. Note that the resistivity $-\rho_{yx}$ (nΩcm) is obtained by measurement of the Hall voltage.

In the range of the magnetic field 0 T to 1.0 T, when the skyrmion 40 is not being generated, the resistivity $-\rho_{yx}$ (nΩcm) remains almost constant regardless of the magnitude of the magnetic field. Here, the resistivity $-\rho_{yx}$ (nΩcm) in a case where current pulses are applied to the magnetic body 10 at the mark x in the figure is indicated with the mark o. When current pulses are applied to the magnetic body 10, the resistivity $-\rho_{yx}$ (nΩcm) increases. That is, it is shown that the skyrmion 40 is generated due to application of current pulses.

Figure 11:
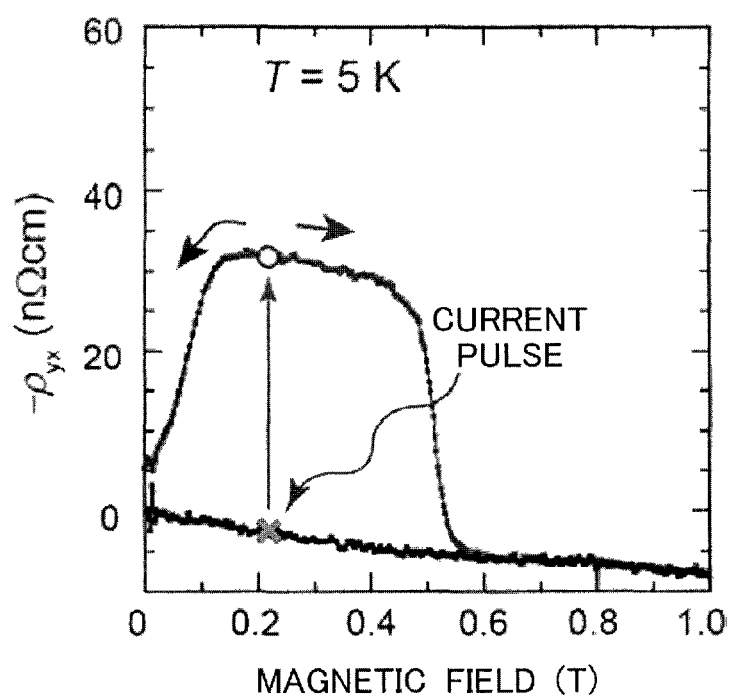
FIG. 11 shows changes in a resistivity according to the skyrmion 40 at a temperature of 5 K.

FIG. 11 shows changes in a resistivity according to the skyrmion 40 at a temperature of 5 K. The horizontal axis indicates a magnetic field (T) applied to the magnetic body 10, and the vertical axis indicates a resistivity $-\rho_{yx}$ (nΩcm) sensed by the skyrmion control unit 30. The magnetic body 10 in the present example is kept at the temperature of 5 K. Note that the resistivity $-\rho_{yx}$ (nΩcm) is obtained by measurement of the Hall voltage.

In the range of the magnetic field 0 T to 1.0 T, when the skyrmion 40 is not being generated, the resistivity $-\rho_{yx}$ (nΩcm) decreases slightly along with an increase in the magnetic field. Here, the resistivity $-\rho_{yx}$ (nΩcm) in a case where current pulses are applied to the magnetic body 10 at the mark x in the figure is indicated with the mark o. When current pulses are applied to the magnetic body 10, the resistivity $-\rho_{yx}$ (nΩcm) increases. That is, it is shown that the skyrmion 40 is generated due to application of current pulses.

As shown above, the skyrmion control unit 30 detects presence and absence of the skyrmion 40 based on changes in the magnitude of the resistivity. Also, the skyrmion control unit 30 detects presence and absence of the skyrmion 40 irrespective of the temperature of the magnetic body 10. The skyrmion control unit 30 in the present example detects generation of numerous (for example, several billions of) skyrmions 40 in order to make it easier to know changes in the resistivity. However, due to the same principles as those in the case of numerous skyrmions 40, presence and absence of a single skyrmion 40 can be detected based on changes in the magnitude of the resistivity.

Figure 12:
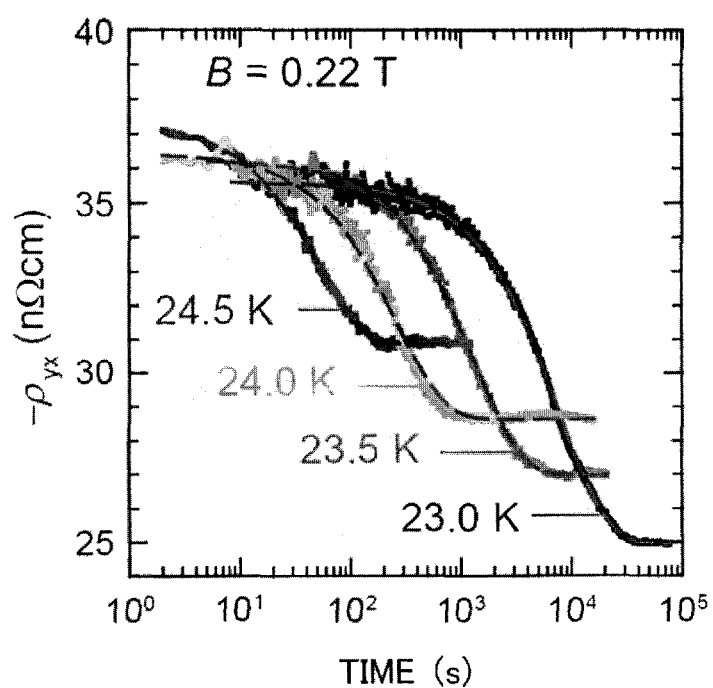
FIG. 12 shows relaxation time $\tau$ concerning disappearance of a rapid-cooling skyrmion phase.

FIG. 12 shows relaxation time τ concerning disappearance of a rapid-cooling skyrmion phase. The horizontal axis indicates time (s), and the vertical axis indicates resistivity $-\rho_{yx}$ (nΩcm) sensed by the skyrmion control unit 30. A magnetic field of 0.22 T is applied to the magnetic body 10 in the present example. Also, each curve corresponds to a respectively different heating temperature for annihilating the skyrmion 40. The heating temperatures are 23.0 K, 23.5 K, 24.0 K and 24.5 K, respectively.

The relaxation time τ is a required length of time starting from application of pulses for annihilation to the magnetic body 10 having the skyrmion 40 in a metastable state and lasting until the skyrmion 40 is annihilated. The relaxation time τ at each temperature is expressed with a length of time required for the resistivity of about 36 (nΩcm) in a case where the skyrmion 40 is present to lower to the resistivity (nΩcm) after annihilation of the skyrmion 40. Upon annihilation of the skyrmion 40, the resistivity (nΩcm) no longer lowers and becomes a constant value. Comparison of respective ones of the relaxation time τ of the temperatures 23.0 K to 24.5 K shows that the relaxation time τ becomes longer as the temperature decreases.

Figure 13:
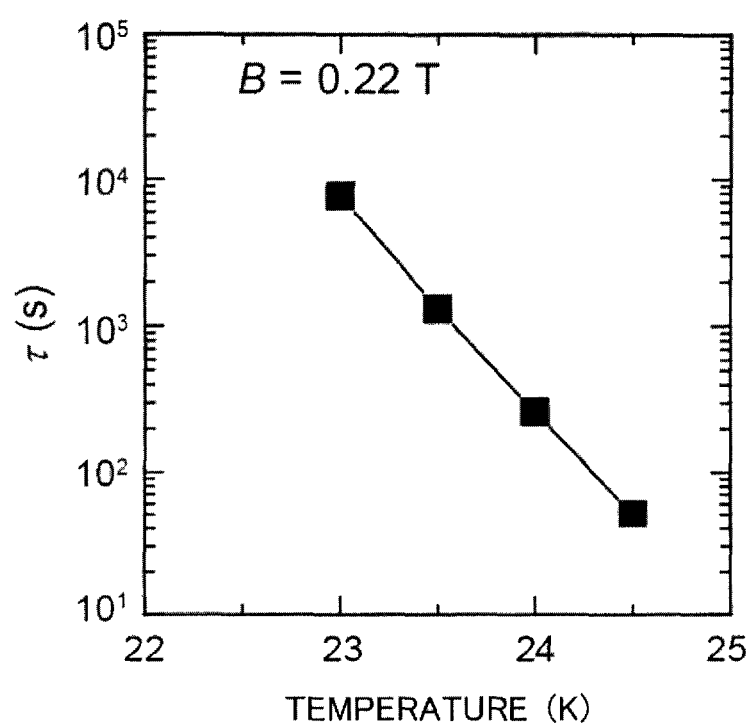
FIG. 13 shows the temperature dependence of the relaxation time $\tau$ of a rapid-cooling skyrmion phase.

FIG. 13 shows the temperature dependence of the relaxation time τ of a rapid-cooling skyrmion phase. The horizontal axis indicates the temperature (K) of the magnetic body 10, and the vertical axis indicates relaxation time τ (s). A magnetic field of 0.22 T is applied to the magnetic body 10 in the present example. Also, the graph in the present example is obtained by calculation of fitting results of the graph in FIG. 12.

The relaxation time τ decreases exponentially as the temperature of the magnetic body 10 rises. That is, the magnetic body 10 settles at a thermodynamically stable state in a relatively short length of time due to high-temperature thermal motion. For example, by setting the heating temperature of the magnetic body 10 at 27 K, it is possible to attain the relaxation time τ of 10 s or shorter. Note that in the present example, numerous (for example, several billions of) skyrmions 40 are generated in a predetermined region, and are annihilated at once. That is, when the skyrmion memory 200 is actually made to operate as a memory, it is sufficient to control a single skyrmion 40, so the skyrmion 40 can be annihilated in a further shorter length of time.

Figure 14:
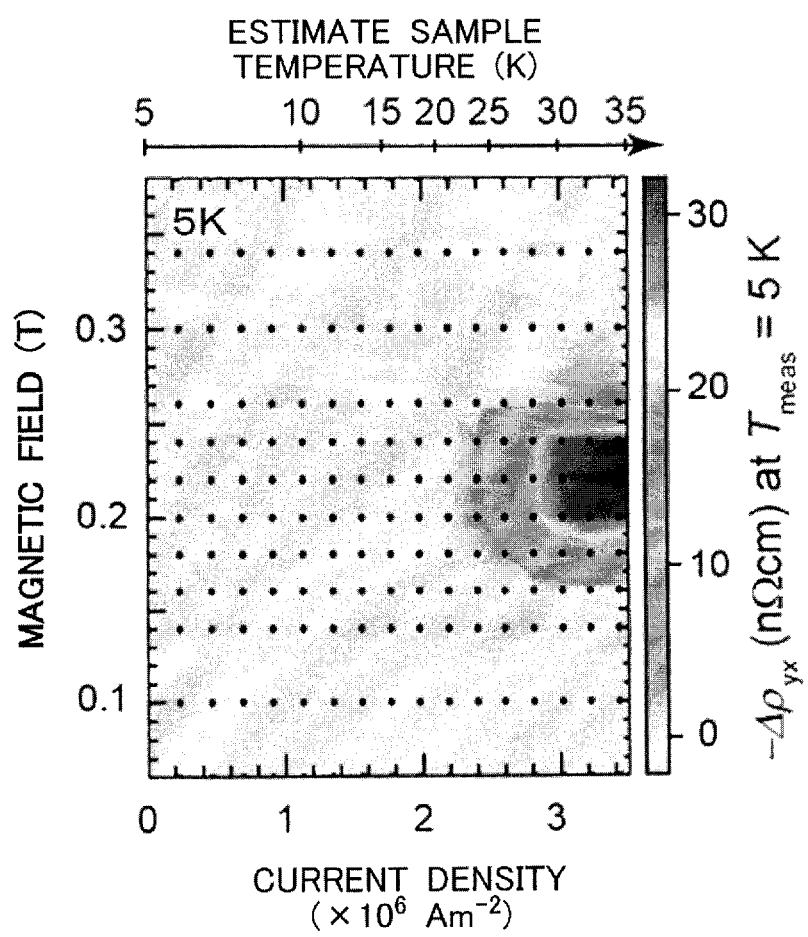
FIG. 14 shows a resistivity distribution of a sample holder at a temperature of 5 K.

FIG. 14 shows a resistivity distribution of a sample holder at a temperature of 5 K. The horizontal axis indicates current density ($\times 10^6$ Am$^{-2}$), and estimate sample temperature (K) corresponding to the current density. The vertical axis indicates a magnetic field (T) applied to the magnetic body 10. The graph in the present example shows a distribution of resistivity $-\Delta\rho_{yx}$ (nΩcm), and darker colors indicate higher resistivities. That is, regions with darker colors indicate that the probability of generating the skyrmion 40 is higher. For example, in regions where the resistivity is 30 (nΩcm) or higher, generation of the skyrmion 40 is successful at a probability of almost 100%.

The skyrmion 40 generation probability is high in regions where the magnetic field is 0.16 T to 0.26 T when current is applied at a density to attain the sample temperature of approximately 25 K or higher. Also, the skyrmion 40 can be generated at a probability of almost 100% in regions where the magnetic field is 0.19 T to 0.24 T when current is applied at a density to attain the sample temperature of approximately 27 K or higher. In this manner, in order to increase the skyrmion 40 generation probability, it is necessary to set the magnitudes of current density and magnetic field at optimal magnitudes.

Figure 15:
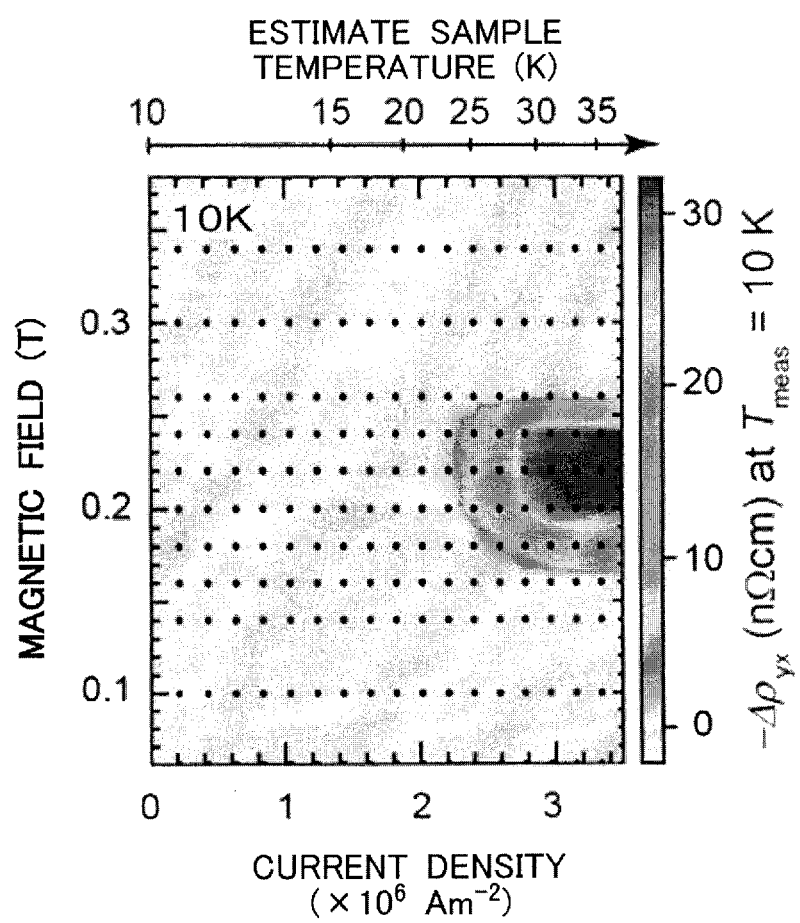
FIG. 15 shows a resistivity distribution of a sample holder at a temperature of 10 K.

FIG. 15 shows a resistivity distribution of a sample holder at a temperature of 10 K. Conditions other than the temperature of the sample holder are similar to those in FIG. 14.

It can be known that the skyrmion 40 generation probability is high in regions where the magnetic field is 0.16 T to 0.26 T when current is applied at a density to attain the sample temperature of approximately 25 K or higher. Also, the skyrmion 40 can be generated at a probability of almost 100% in regions where the magnetic field is 0.19 T to 0.24 T when current is applied at a density to attain the sample temperature of approximately 27 K or higher. In this manner, in order to increase the skyrmion 40 generation probability, it is necessary to set the magnitudes of current density and magnetic field at optimal magnitudes.

Figure 16:
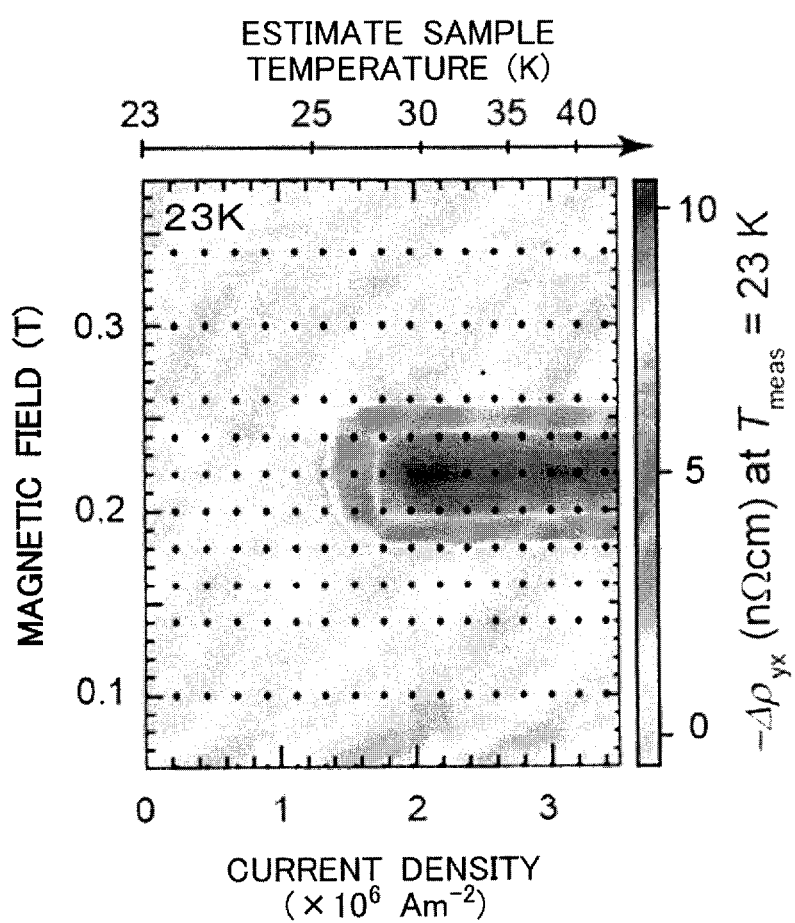
FIG. 16 shows a resistivity distribution of a sample holder at a temperature of 23 K.

FIG. 16 shows a resistivity distribution of a sample holder at a temperature of 23 K. Conditions other than the temperature of the sample holder are similar to those in FIG. 14 and FIG. 15. However, it is shown in the present example that generation of the skyrmion 40 is successful at a probability of almost 100% in dark regions where the resistivity is 10 (nΩcm) or higher.

It can be known that the skyrmion 40 generation probability is high in regions where the magnetic field is 0.18 T to 0.25 T when current is applied at a density to attain the sample temperature of approximately 27 K or higher. Also, the skyrmion 40 can be generated at a probability of almost 100% in regions where the magnetic field is 0.20 T to 0.24 T when current is applied at a density to attain the sample temperature of approximately 27 K or higher. In this manner, in order to increase the skyrmion 40 generation probability, it is necessary to set the magnitudes of current density and magnetic field at optimal magnitudes.

Figure 17:
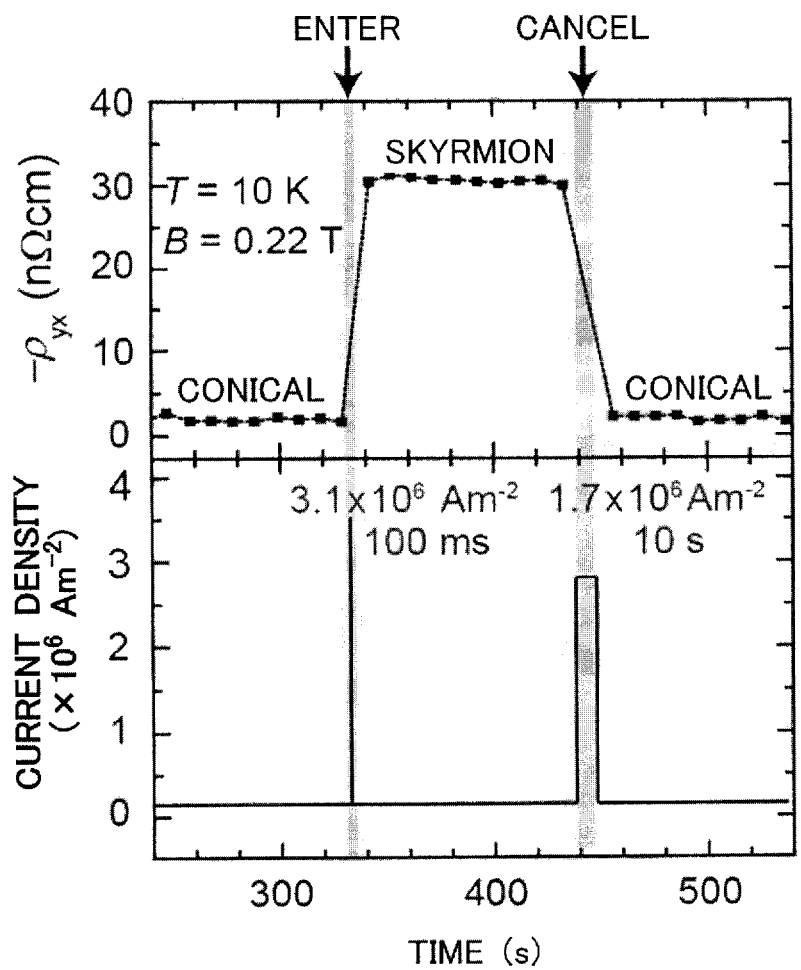
FIG. 17 shows skyrmion phase entrance and cancellation steps.

FIG. 17 shows skyrmion phase entrance and cancellation steps. The horizontal axis indicates time (s), and the vertical axis indicates resistivity $-\rho_{yx}$ (nΩcm) and current density ($\times 10^6$ Am$^{-2}$). The magnetic body 10 in the present example is kept at a temperature of 10 K, and a magnetic field of 0.22 T is applied to it.

The entrance step is a step to bring about a phase shift of the magnetic body 10 from the conical phase to the skyrmion phase. At the entrance step, the skyrmion control unit 30 applies current pulses with predetermined pulse intensity and pulse width to the magnetic body 10. The pulse intensity corresponds to current density. The skyrmion control unit 30 in the present example applies, to the magnetic body 10, a current with the current density of $3.1\times 10^6$ Am$^{-2}$ at the pulse width of 100 ms.

The cancellation step is a step to bring about a phase shift of the magnetic body 10 from the skyrmion phase to the conical phase. At the cancellation step, the skyrmion control unit 30 applies current pulses with predetermined current density and pulse width to the magnetic body 10. For example, the skyrmion control unit 30 applies, to the magnetic body 10, current pulses with the pulse intensity lower than the pulse intensity at the entrance step. Also, the skyrmion control unit 30 applies, to the magnetic body 10, current pulses with the pulse width larger than that of the current pulses at the entrance step. That is, at the cancellation step, the skyrmion control unit 30 preferably heats the magnetic body 10 for a long time at a temperature lower than the one in the entrance step. The skyrmion control unit 30 in the present example applies, to the magnetic body 10, a current with the current density of $1.7\times 10^6$ Am$^{-2}$ as pulses at 10 s.

Figure 18:
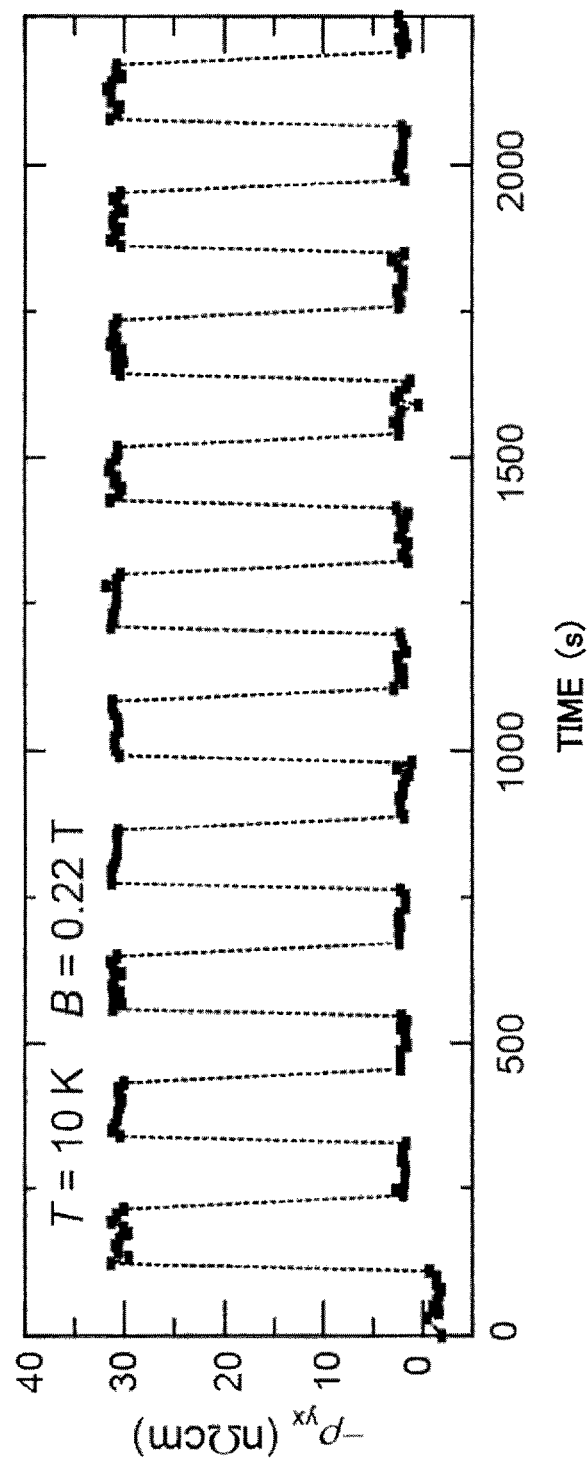
FIG. 18 shows a switching operation at the skyrmion phase entrance and cancellation steps.

FIG. 18 shows a switching operation at the skyrmion phase entrance and cancellation steps. The horizontal axis indicates time (s), and the vertical axis indicates resistivity $-\rho_{yx}$ (nΩcm). The magnetic body 10 in the present example is retained at a temperature of 10 K, and a magnetic field of 0.22 T is applied thereto. The skyrmion phase is entered when the resistivity is 30 (nΩcm), and the skyrmion phase is cancelled and the conical phase is entered when the resistivity is 2 (nΩcm). It can be known from the graph that repetitive entrance and cancellation of the skyrmion phase are possible at a predetermined cycle. In this manner, the skyrmion memory 200 can control the temperature of the magnetic body 10 by utilizing heat generation by means of current and control generation and disappearance of the skyrmion 40 in the metastable state.

In the switching operation in the present example, numerous (for example, several billions of) skyrmions 40 are generated and annihilated at once by forming the skyrmions 40 in a predetermined region. However, when the skyrmion memory 200 is actually made to operate as a memory, individual skyrmions 40 may be switched singly; thus, generation and annihilation of the skyrmions 40 can be controlled in a shorter length of time. Because generation and annihilation of the skyrmions 40 are performed by control on magnetic moments, switching in a short length of time can be realized as compared with a conventional phase-change memory that changes the state between an amorphous phase and a crystal phase.

Figure 19:
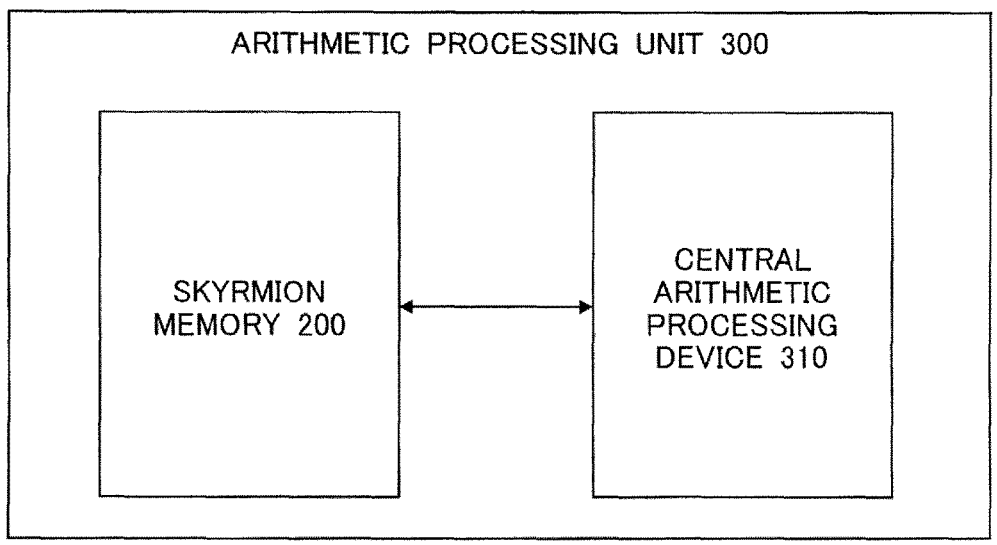
FIG. 19 shows a configurational example of an arithmetic processing unit 300.

FIG. 19 shows a configurational example of an arithmetic processing unit 300. The arithmetic processing unit 300 comprises the skyrmion memory 200 and the central arithmetic processing device 310.

The central arithmetic processing device 310 is, for example, a CMOS-LSI device formed on a Si substrate. The central arithmetic processing device 310 writes various types of arithmetic processing data into the skyrmion memory 200. Also, the central arithmetic processing device 310 may have a function of reading out a data processing operating system program and various types of data from the skyrmion memory 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: magnetic body; 12: first surface; 14: second surface; 20: magnetic field generating unit; 30: skyrmion control unit; 31: laser source; 32: laser beam; 33: first electrode; 34: second electrode; 35: magnetic metal; 36: insulator; 37: power source; 38: ammeter; 40: skyrmion; 50: insulator; 100: magnetic element; 200: skyrmion memory; 300: arithmetic processing unit; 310: central arithmetic processing device

What is claimed is:

1. A magnetic element comprising:
    a magnetic body that has a spiral magnetic structure in a stable state; and
    a skyrmion control unit that
        generates a skyrmion in the magnetic body by supplying energy to the magnetic body that has the spiral magnetic structure,
        brings the magnetic body into an unstable state by supplying thermal energy pulses to the magnetic body, and
        heats the magnetic body so as to bring the magnetic body to a temperature higher than an equilibrium skyrmion phase in a magnetic phase diagram of the magnetic body.

2. The magnetic element according to claim 1, wherein the skyrmion control unit generates the skyrmion by cooling of the magnetic body after supplying energy to the magnetic body.

3. The magnetic element according to claim 2, wherein the skyrmion control unit cools the magnetic body so as to bring the magnetic body to a temperature lower than the equilibrium skyrmion phase in the magnetic phase diagram of the magnetic body.

4. The magnetic element according to claim 2, wherein the skyrmion control unit cools the magnetic body by terminating heating of the magnetic body.

5. The magnetic element according to claim 2, wherein the skyrmion control unit rapidly cools the magnetic body at a cooling speed of 20 K/s or faster.

6. A skyrmion memory comprising the magnetic element according to claim 1, wherein the skyrmion control unit detects presence and absence of the skyrmion.

7. An arithmetic processing unit comprising the skyrmion memory according to claim 6.

8. A magnetic element comprising:
    a magnetic body that has a spiral magnetic structure in a stable state; and
    a skyrmion control unit that
        generates a skyrmion in the magnetic body by supplying energy to the magnetic body that has the spiral magnetic structure,
        brings the magnetic body into an unstable state by supplying thermal energy pulses to the magnetic body, and
        annihilates the skyrmion generated in the magnetic body by supplying energy to the magnetic body;
    wherein the skyrmion control unit annihilates the skyrmion at a pulse intensity which is lower than a pulse intensity at a time of skyrmion generation and at a pulse width which is larger than a pulse width at the time of skyrmion generation.

9. A skyrmion memory comprising the magnetic element according to claim 8, wherein the skyrmion control unit detects presence and absence of the skyrmion.

10. An arithmetic processing unit comprising the skyrmion memory according to claim 9.

* * * * *